United States Patent [19]

Shibagaki et al.

[11] Patent Number: 4,532,186
[45] Date of Patent: Jul. 30, 1985

[54] CIRCUIT SUBSTRATE WITH RESISTANCE LAYER AND PROCESS FOR PRODUCING THE SAME

[75] Inventors: Kazuyoshi Shibagaki; Yoshihisa Mori; Takahiko Moriuchi, all of Osaka, Japan

[73] Assignee: Nitto Electric Industrial Co., Ltd., Osaka, Japan

[21] Appl. No.: 505,126

[22] Filed: Jun. 16, 1983

[30] Foreign Application Priority Data

Jun. 16, 1982 [JP] Japan .................................. 57-104592
Dec. 4, 1982 [JP] Japan .................................. 57-212948

[51] Int. Cl.³ .............................................. B32B 15/04
[52] U.S. Cl. ..................................... 428/457; 428/639;
428/901; 252/512; 252/513; 252/514
[58] Field of Search ............... 428/457, 209, 901, 639;
252/512, 513, 514; 75/128 R, 128 P

[56] References Cited

U.S. PATENT DOCUMENTS 4,311,768 1/1982 Berdan et al. ........................ 428/901
4,350,743 9/1982 Lazzari ................................. 428/457
4,360,564 11/1982 Philipp ................................. 428/457

Primary Examiner—Josephine L. Barr
Attorney, Agent, or Firm—Sughrue, Mion, Zinn, Macpeak and Seas

[57] ABSTRACT

A circuit substrate with a resistance layer and a process for producing the same are disclosed. The circuit substrate comprises an electrically insulating layer, a resistance layer bonded to at least one surface of the electrically insulating layer and a highly conductive material layer bonded to the resistance layer, and has a high sheet resistance value. The resistance layer comprises an alloy containing tin, nickel, sulfur and optionally specific elements.

4 Claims, 19 Drawing Figures

CIRCUIT SUBSTRATE WITH RESISTANCE LAYER AND PROCESS FOR PRODUCING THE SAME

FIELD OF THE INVENTION

This invention relates to a circuit substrate with a resistance layer and a process for producing the same.

BACKGROUND OF THE INVENTION

Heretofore, the circuit substrate having incorporated therein a resistance material layer has been generally provided in the form of a laminate comprising an electrically insulating material layer as supporter, a resistance layer bonded to the surface of the insulating layer, and a highly conductive material layer bonded to the resistance layer. The desired resistance circuit pattern has been prepared by forming, in conformity with a prescribed circuit pattern, an insulating region (obtained by the removal of all the layers deposited on the insulating layer), a resistance layer (obtained by the removal of only the layer of highly conductive material), and a conductor region (obtained without removal of any layer; normally having the surface thereof plated with a thin layer of a noble metal such as gold) by the subtractive process (mask-etching process) or by directly forming the resistance elements and the conductive elements (as electrodes) by printing on the insulating layer through screen printing plates having prescribed patterns.

The material used for the resistance layer in the art of this field comprises carbon sources, metal oxide sources, metal sources, or mixtures thereof. The method comprising printing a paste-like material obtained by mixing, for example, carbon particles with various resin components, the method comprising carbonizing and depositing various hydrocarbon compounds under various conditions, and the method comprising depositing or sputtering a metal or an alloy comprising at least two metals are known as the method for forming the resistance layer from such a material.

In the case of the method comprising printing the paste-like material, the resistance value conferred upon the resistance element is not easily controlled, the resistance value greatly varies over the entire region of the circuit board and the properties of the resistance elements are not satisfactory. In the method comprising depositing or sputtering a metal or alloy, the control of the resistance value is difficult and the facilities required for the operation of this method become expensive.

In recent years, therefore, a great attention has been made to the method which can produce the resistance layer efficiently and inexpensively by plating in a stable manner with a large area. Japanese Patent Application (OPI) No. 73762/1973 (corresponding to U.S. Pat. No. 3,808,576) discloses a method which produces a resistor comprising nickel-phosphorus alloy by electroplating and Japanese Patent Application (OPI) No. 71513/1975 (corresponding to U.S. Pat. No. 3,857,683) discloses a method which forms a resistance layer comprising various binary alloys other than the alloy mentioned above by electroplating. The alloys mentioned above, however, have various defects in the properties and processability as materials for the desired resistance elements.

In the circuit substrate having a resistance layer of thin metal film, the resistance elements having the desired resistance value per unit area (sheet resistance value) can be obtained by decreasing the film thickness. The thickness of the metal film, however, has its own limit because the microscopic uniformity of the metal film tends to be difficult to obtain as the thickness of the metal film decreases. The sheet resistance value of the nickel-phosphorus alloy which can be industrially produced is at most 100 ohms per square and a film of this alloy having a greater sheet resistance value cannot be obtained. In addition, the steps of the subtractive process involve serious drawbacks.

In the subtractive process, the first step is to apply a photoresist to the entire surface of a copper foil (highly conductive material) on the circuit substrate. Then, the resulting photoresist coating is exposed to light through a photomask of a pattern which allows the photoresist to remain intact in the portions intended to form a resistance element and a conductor portion, followed by developing. Unnecessary copper and also resistance layer are sequentially etched out with the respective etching solution to form an insulating region. Thereafter, the circuit substrate thus treated is exposed to light through a photomask of a pattern which allows the photoresist to remain intact only in the portion intended to form the conductor portion, followed by developing. Then, the exposed portion of the copper foil is etched out (for the formation of the resistance element) to obtain the desired circuit board (wherein the photoresist still remains on the surface of the conductor portion).

In the procedure described above, in the removal by etching of the portion of copper foil corresponding to the resistance region, it is imperative for the material of the resistance layer to be stable enough against the etching solution and to be not substantially etched.

Unfortunately, it has been ascertained that the resistance element which is formed of the nickel-phosphorus alloy exhibits poor etching selectivity relative to the copper foil, so that the resistance element is partially etched out when the copper foil on the resistance element is removed by etching and, consequently, the resistance value of the resistance element is greatly increased. In other words, the initially predetermined resistance value does not agree to the resistance value of the resistance element after processing.

Although the various binary alloys disclosed in Japanese Patent Application (OPI) No. 71513/1975 have been proposed as products which can provide higher sheet resistance value than that of a plating film of the respective single metal in the same plating conditions, they have not yet been industrially employed for the following reasons. Those alloys have the problem that it is difficult to balance the increase of the sheet resistance value due to the decrease of the thickness of the resistance layer with the various properties of the resistance element such as the etching selectivity and also the problem that it is extremely difficult to produce a plating film of alloy comprising constant compositions and free from scattering of the resistance value from a plating bath in a stable manner.

A tin-nickel alloy is proposed as a material for the resistance element different from the above-described various alloys. This alloy has various advantages that a thinner film can be formed as compared with the above-described alloys so that the sheet resistance value in the range of at most about 300 to 400 ohms per square can be obtained, the etching selectivity is improved and the uniform electrodepositing property when the film is formed by electroplating is excellent.

SUMMARY OF THE INVENTION

As a result of continued investigations on the resistance material comprising tin-nickel alloy, it has been found that when the tin-nickel alloy further contains sulfur alone or sulfur and at least one element selected from the group consisting of metal elements of Group Ib, Group IIb, and Groups VIb through VIIIb (except nickel) of the long period-type Periodic Table, the circuit substrate having a higher sheet resistance value can be obtained.

Accordingly, an object of this invention is to provide a circuit substrate with a resistance layer comprising an electrically insulating layer, a resistance layer bonded to at least one side of the electrically insulating layer and a highly conductive material layer bonded to the resistance layer, wherein the resistance layer is a ternary alloy comprising tin, nickel, and sulfur or a more than quaternary alloy comprising tin, nickel, sulfur, and additional specific metal element(s).

Another object of this invention is to provide a process for producing the circuit board with resistance elements.

DETAILED DESCRIPTION OF THE INVENTION

Figure 1:
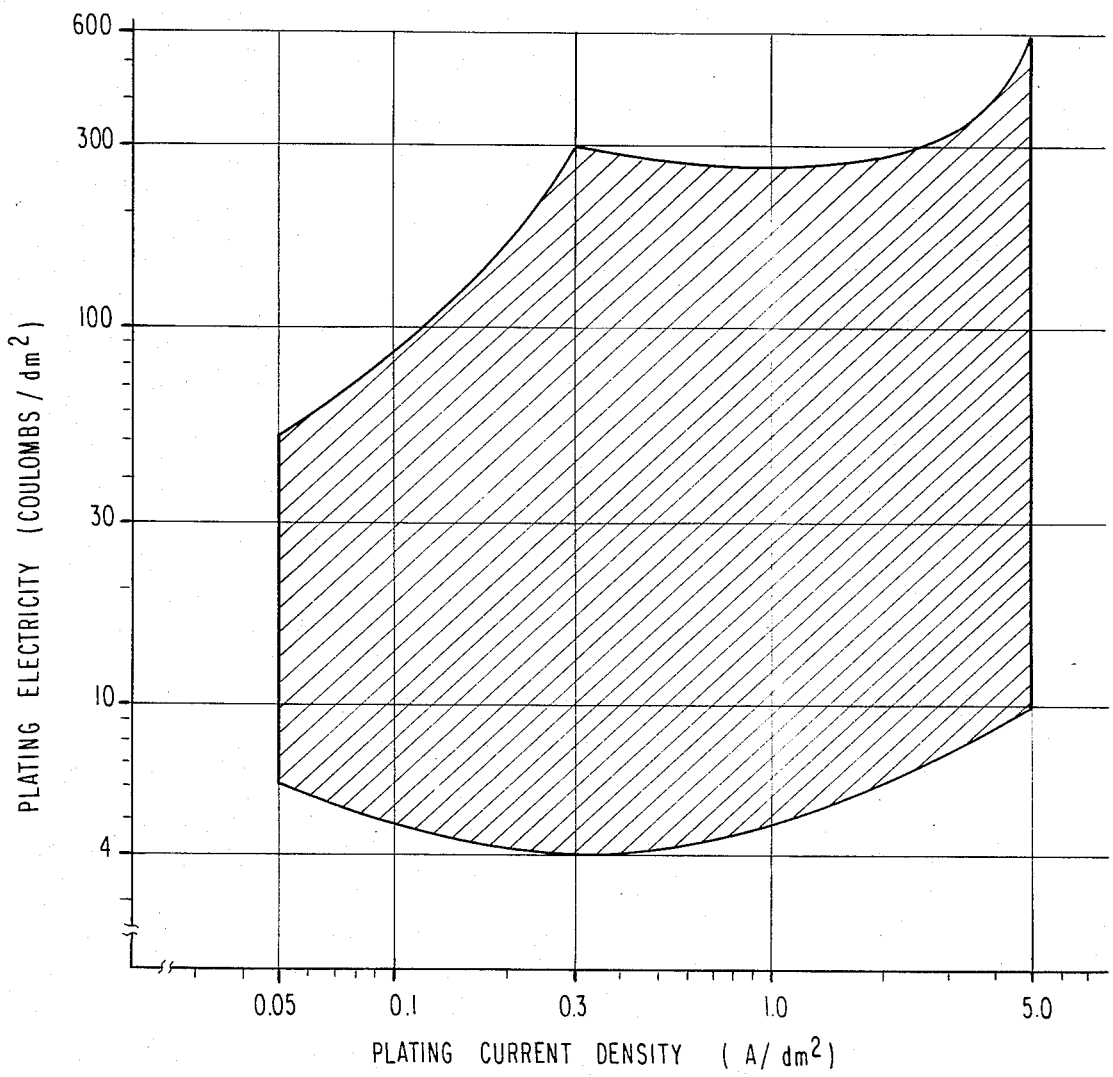
FIG. 1 is a graph showing the range of plating conditions suitable for the formation of a resistance layer in the circuit substrate with a resistance layer according to the present invention.

According to the ternary alloy or more than quaternary alloy according to the present invention, a good etching selectivity and a uniform electrodepositing property during the course of electroplating can be obtained as in the above-described tin-nickel alloy and a circuit substrate having a extremely high sheet resistance value can be easily obtained in a stable manner.

In the case of the tin-nickel alloy, for example, the film thickness of resistance layer must be formed in a thickness of not more than 100 Å to afford sheet resistance value of the order of about 100 ohms per square and in a much smaller thickness to afford sheet resistance value of the order of about 300 to 400 ohms per square. In contrast, in the case of the ternary alloy or more than quaternary alloy of the present invention, the film as resistance layer formed therefrom can be made to acquire the sheet resistance value of about 500 ohms per square by suitably fixing the contents of sulfur and the additional specific element(s) (hereinafter referred to as "component X") in the alloy without requiring the thickness of the film to be appreciably decreased, i.e. allowing the thickness of the film to fall in a wide range of 200 to 300 Å up to even several thousand Å. When the thickness of the film as resistance layer is decreased, the sheet resistance value is further increased. Thus, the alloy of this invention easily produces resistance films having higher sheet resistance value of up to about $10^4$ ohms per square in a stable manner.

Moreover, the circuit substrate of the present invention has a very excellent resistance stability by the use of the ternary alloy or more than quaternary alloy as the material for the resistance layer. The rate of change of the resistance value when the circuit board is allowed to stand at high temperatures or under an atmosphere of high humidity is small. From this point of view, the present invention has the advantage of providing a circuit substrate of a very high reliability.

It is not completely clear the reason why the resistor of the more than ternary alloy of this invention exhibits the advantageous effects described above, but it is believed that those advantageous effects are ascribed to the micro-crystallization of particles of the alloy and the change of the crystal structure of the alloy due to the incorporation therein of the additional specific element(s) and also sulfur as a non-metallic element.

A copper foil is most generally used as a material for the highly conductive layer used in the present invention, but any conventional materials such as nickel foil, tin-plated copper foil, and zinc foil can also be used. The method of producing the highly conductive material is not specifically limited, and the highly conductive materials produced by various methods can be used.

The resistance layer comprising the more than ternary alloy according to the present invention is generally formed on the highly conductive material by electroplating. The composition of this alloy is as described below.

The ternary alloy comprises 30 to 85% by weight, preferably 35 to 80% by weight, of tin based on the total weight of tin and nickel, 70 to 15% by weight, preferably 65 to 20% by weight, of nickel based on the total weight of tin and nickel and sulfur having a relative strength ratio determined by the ESCA measurement to nickel contained of 4 to 70%, preferably 5 to 60%.

The more than quaternary alloy comprises 30 to 84.99% by weight, preferably 35 to 79.95% by weight, of tin based on the total weight of tin, nickel, and element X, 15 to 69.99% by weight, preferably 20 to 64.95% by weight, of nickel based on the total weight of tin, nickel, and element X, and 0.01 to 30% by weight, preferably 0.05 to 28% by weight, of the element X based on the total weight of tin, nickel, and element X, and sulfur having a relative strength ratio determined by the ESCA measurement to the nickel contained of 3 to 100%, preferably 4 to 80%.

If the contents of tin, nickel and the element X in the alloy composition are outside the respective range, the circuit substrate produced does not have a sufficiently high sheet resistance value and, therefore, desirable circuit properties are difficult to obtain. Particularly, the presence of the element X in conjunction with sulfur contributes to increase the sheet resistance value and therefore, the content of the element X must be determined within the optimum range described above taking into consideration the sulfur content. If the sulfur content is too low, the sheet resistance value does not become so high. On the other hand, if the sulfur content is too large, good circuit properties, particularly moisture-proofing property over a long period of time, cannot be obtained.

The term "ESCA" as used in the specification is the abbreviation for "Electron Spectroscopy for Chemical Analysis". Specifically, the expression "ESCA measurement" means the actual analysis of the photoelectron spectrum of a specimen on the DuPont-Shimazu X-ray electron spectroscope, ESCA 650B, using MgKα ray as the X-ray. Such ESCA measurements are generally employed in determining the relative content of an element in a specimen and expressing it in terms of relative strength to a specific metal. In the present invention, the actual ESCA measurement has been effected by etching out the highly conductive material of a circuit substrate thereby exposing the underlying resistance layer and subjecting the exposed surface of the resistance layer to the photoelectron spectrometry.

The formation of the resistance layer by the electroplating technique is carried out by using a plating solution which contains a tin salt, a nickel salt, a salt of element X, an alkali metal salt of polyphosphoric acid, a water-soluble organic sulfur compound or a salt thereof, and an α-amino acid (except a sulfur-containing amino acid) or a salt thereof, and electrodepositing the resistance layer on the highly conductive material from the plating solution.

Examples of the tin salt include stannous chloride, stannous pyrophosphate, stannous sulfate, etc. These tin salts can be used alone or as mixtures thereof. The amount of the tin salt used is in the range of 2 to 50 g/liter, preferably 3 to 40 g/liter, calculated as a metal.

Examples of the nickel salt include nickel chloride, nickel pyrophosphate, nickel sulfamate, nickel sulfate, etc. These nickel salts can be used alone or as mixtures thereof. The amount of the nickel salt used is in the range of 1.5 to 25 g/liter, preferably 3 to 20 g/liter, calculated as a metal.

Examples of the salt of element X include chlorides, pyrophosphates, sulfates, and sulfamates of the elements of Group Ib (such as copper and silver), Group IIb (such as zinc), and Groups VIb through VIIIb (such as manganese, iron, cobalt, molybdenum, tungsten, and palladium) of the long period-type Periodic Table, and ammonium salts and alkali metal salts of the oxides of the above-described elements. These metal salts of element X can be used alone or as mixtures thereof. The amount of the salt of component X used is in the range of 0 to 10 g/liter, preferably 0 to 7 g/liter, calculated as a metal.

Examples of the alkali metal salt of polyphosphoric acid include potassium salt and sodium salt thereof. These alkali metal salts can be used alone or as mixtures thereof.

The term "polyphosphoric acid" used herein is a generic name for the compounds represented by the general formula:

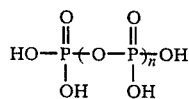

wherein n is a positive integer. It is desired for the present invention to use the polyphosphoric acid of the above formula wherein n is an integer of 1 to 3. Specifically, the polyphosphoric acid is pyrophosphoric acid when n is 1, tripolyphosphoric acid when n is 2, and tetrapolyphosphoric acid when n is 3. The alkali metal salt of polyphosphoric acid serves to dissolve the tin salt, nickel salt, salt of element X, etc. in the form of polyphosphoric complexes in the plating solution. The amount of the alkali metal salt of polyphosphoric acid is preferably 100 to 450 g/liter in view of the total amount of the tin salt, nickel salt, and salt of element X.

The water-soluble organic sulfur compound or a salt thereof serves to include sulfur atoms in the plating coating alloy. Examples of the water-soluble organic sulfur compound or salt thereof include thioalcohol compounds having a —SH group, polysulfide compounds having a —S—$_n$ bond (wherein n is 2 to 4), thioether or sulfonium compounds having a —S— or

bond, thiolactone compounds having a cyclic —S— bond, thiocarbonyl compounds having a —C(=S)— bond, sulfonic acid compounds having a —SO$_3$H group, sulfoxide or sulfone compounds having a —S(=O)$_n$— bond (wherein n is 1 or 2), thio-carboxylic acids having a

group, dithiocarboxylic acids having a

group, and salts thereof.

For the organic sulfur compounds and salts thereof to be water-soluble, it is desired that those compounds contain amino group, hydroxyl group, carboxyl group, or the like in the molecule or are in the form of alkali metal salts such as potassium salts or sodium salts, amine salts, ammonium salts, and mineral acid salts thereof.

The sulfur compound or salt thereof has the molecular weight of 45 to 550, preferably 65 to 450. The sulfur content in the sulfur compound or salt thereof is generally 5 to 80% by weight, preferably 8 to 70% by weight. Of the water-soluble organic sulfur compounds or salts thereof, a sulfur-containing amino acid or a salt thereof is preferred.

Examples of the organic sulfur compound or salt thereof include cysteine, homocysteine, cysteine hydrochloride, 2-thiol histidiene, glutathione, thioglycolic acid, 2-mercapto-propionic acid, sodium 2-mercaptopropionate, sodium thioglycolate, 1-thiosorbitol, 1,2-dithioglycerol, 2-mercaptoethanol, 2-aminoethane thiol, 6-mercaptopurine, thiomalic acid, sodium 2-mercaptobenzoate, calcium 2-mercaptopropionate, 2-mercaptobenzothiazole, cystine, homocystine, cystamine hydrochloride, dithiodiglycolic acid, 3,3'-dithiodipyridine hydrochloride, 4,4'-dithiodimorpholine, distearyl trisulfide, distearyl tetrasulfide, methionine, ethionine, cystathionine, thiomorpholine, active methionine, vitamine U, thiodiglycolic acid, 2,2'-thiodiethanol, thiazol, thianaphthene, 3,3'-thiodipropionic acid, 2-thiophene carboxylic acid, thiodiglycol, homocysteine thiolactone hydrochloride, thiourea, thiosinamine, ethylene-thiourea, thioformamide, thioacetamide, thiosemicarbazide, cysteic acid, sodium cyclohexyl sulfamate, sodium p-toluenesulfonate, systine disulfoxide, saccharin, ammonium saccharin, sodium saccharin, chloramine-T, thiol acetic acid, thiol butyric acid, dithiosalicylic acid, dithiobenzoic acid piperidinium, etc. These organic sulfur compounds or salts thereof can be used alone or as mixtures thereof. The amount of the compound used is 0.05 g/liter to the saturated concentration, preferably 0.1 to 20 g/liter.

Examples of the α-amino acid which is added if required and necessary include glycine, histidine hydrochloride, phenyl alanine, leucine, aspartic acid, glutamic acid, etc. The amount of the α-amino acid added is 0 to 50 g/liter, preferably 5 to 30 g/liter. These α-amino acids can be used alone or as mixtures thereof. Further, for the purpose of improving the plating efficiency and the characteristics of the product, hydrochloric acid, sulfuric acid, sufamic acid, pyrophosphoric acid, aqueous ammonia, or potassium hydroxide may be added as a pH adjusting agent of the plating bath in an appropriate amount.

The electroplating using the plating solution is preferably carried out with the plating bath temperature of 20° to 60° C., the plating current density of 0.01 A/dm$^2$ or more, and the total quantity of plating electricity of 3 to 1,000 coulombs/dm$^2$. Taking into consideration the plating operability and cost of plating work, the most preferred conditions are that the plating current density is 0.05 to 5.0 A/dm$^2$ and the total quantity of plating electricity is 4 to 600 coulombs/dm$^2$. If the plating bath temperature is not proper and the plating current density is excessively low, the plating bath is deprived of its stability, causing scattering of the resistance value of the resistor obtained and lowering of various characteristics.

The anode which can be used in the electroplating can be an insoluble electrode such as carbon electrode, platinum-coated titanium electrode or stainless steel electrode and a soluble electrode such as nickel electrode or nickel-tin alloy electrode.

After forming the resistance layer on a highly conductive material, an electrically insulating layer is provided on the resistance layer by a conventional method to obtain the circuit substrate with a resistance layer according to the present invention. As the material for the formation of the electrically insulating layer as supporter, epoxy resin, polyimide, polyester or other thermosetting resin can be advantageously used. Alternatively, a prepreg formed by impregnating glass cloth or other fibrous substrate with such a resin may be used as the material. By heat pressing (curing) this material to the resistance layer on a highly conductive material, an insulating layer having excellent electrical properties and heat resistance can be obtained.

Thus, the present invention can provide a process of producing a circuit substrate with a resistance layer, which comprises using a plating solution containing, calculated as a metal, 2 to 5 g/liter of a tin salt, 1.5 to 25 g/liter of a nickel salt, 0 to 10 g/liter of a metal salt X (salt of element X), 100 to 450 g/liter of an alkali metal salt of polyphosphoric acid, 0.05 g/liter to the saturated concentration of a water-soluble organic sulfur compound or a salt thereof, and 0 to 50 g/liter of an α-amino aid (except sulfur-containing amino acid) or a salt thereof and forming a resistance layer on the highly conductive layer from the plating solution by electroplating.

FIG. 2 illustrates a typical production step involved in the production of a circuit board from the circuit substrate of this invention which is produced as described above. This process step is not particularly different from the conventional process for the production of the circuit board.

In step (A), a photoresist 4 is formed on a highly conductive material 1. Then, in step (B), the photoresist 4 is exposed to light through a photomask and developed to form a desired pattern. Subsequently, in step (C), a nickel plating 5 and a gold plating 6 are applied to the portions from which the photoresist has been removed to form a plurality of paired electrodes 7. In step (D), the remaining photoresist 4 is exposed to light once again through a photomask which allows to remain the film of photoresist on only the portion between the two electrodes 7 and developed. Then, in step (E), the highly conductive material layer 1 and the resistance layer 2 which are exposed on the portion where the photoresist has been removed in step (D) are etched off to expose the electrically insulating layer 3. Subsequently, in step (F), the photoresist 4 remaining between the two electrodes 7 is removed to expose the highly conductive material 1, which is etched off in the subsequent step (G). Thus, the resistance layer 2 which extends as far as the outermost sides of the two electrodes 7 is left to form a resistance element. On the top of this resistance layer, a protective film 8 is formed in the subsequent step (H) to form a circuit board.

As described in detail above, one of the great characteristics of the circuit substrate with a resistance layer according to the present invention is that the resistance layer having a high sheet resistance value ranging from about 100 ohms per square to about 10 kiloohms per square can be freely formed in a desired thickness and the circuit substrate has excellent heat resistance and moisture-resistance and enjoys high reliability of the resistor performance.

This invention also has the advantage to produce a high quality circuit substrate having the sheet resistance value of 400 ohms per square or more, preferably 400 to 4000 ohms per square, most preferably 500 to 2000 ohms per square, which cannot easily attained by the resistance layer made of the tin-nickel alloy and also having an excellent resistance stability, in a stable manner.

The present invention will be now described more specifically below by reference to the examples of the invention. It should be noted, however, that this invention is not limited to these examples.

EXAMPLE 1

An electrolytic copper foil having a thickness of 35μ was cut into a size of 20 cm×20 cm. A masking adhesive protective sheet was press bonded to the entire surface on the drum's side of the copper foil in producing the copper foil (in the shape of roll). The laminated product was immersed in a cleansing solution (an aqueous solution prepared by diluting 1 volume of a concentrated solution of Neutra-Clean 68 made by Shiply Company Inc. with 1 volume of water) at room temperature for 3 minutes, washed with running water and washed again with deionized water. The laminated product was subsequently immersed in an aqueous solution containing 200 g/liter of ammonium persulfate and 15 ml/liter of concentrated sulfuric acid (this solution is hereinafter referred to simply as "ammonium persulfate treating solution") at room temperature for 2 minutes, washed with water, and immediately plated with a tin-nickel-sulfur alloy under the conditions of 0.5 A/dm$^2$ of current density, 25° C. of plating bath temperature, and a prescribed period of immersion time to form a resitance layer. The plating bath had the following composition.

| | |
|---|---|
| Stannous chloride (SnCl$_2$.2H$_2$O) | 30 g/liter |
| Nickel chloride (NiCl$_2$.6H$_2$O) | 30 g/liter |
| Potassium pyrophosphate (K$_4$P$_2$O$_7$) | 200 g/liter |
| Glycine (NH$_2$CH$_2$COOH) | 20 g/liter |
| Cysteine hydrochloride (HSCH$_2$CH(NH$_2$)COOH:HCl.H$_2$0) | 1.5 g/liter |

After the resistance layer was formed on the copper foil piece as described above, the product was thoroughly washed with water and dried. The protective sheet on the copper foil piece was peeled off and a glass cloth impregnated with epoxy resin (generally called "prepreg") was superposed on the resistance layer and heat bonded thereto with a laminating press machine to obtain a circuit substrate with a resistance layer.

Using a circuit substrate wherein the plating time for the formation of a resistance layer was fixed at 150 second (75 coulombs/dm$^2$) in Example 1, the compositions of the ternary alloy constituting the resistance layer of this circuit substrate were analyzed by the method described below. The results were as shown in Table 1.

Determination of Alloy Composition

The copper foil piece in a sample substrate with a resistance layer was wholly etched out with Neutra-Etch V-1 (copper etching solution made by Shiply Company Inc., 50° C., pH=7.6 to 7.8).

After thoroughly washing with water, a piece having a size of 2 cm×2 cm was cut from the central portion of the circuit substrate, washed thoroughly again with deionized water, and dried to use a specimen for the determination of ESCA, i.e. the measurement of the sulfur content in the alloy in terms of the relative strength ratio of sulfur to the nickel also contained in the alloy. In the meantime, the remainder of the circuit substrate was thoroughly washed again with deionized water and dried, then dissolved completely using a dissolving solution of 30 ml of concentrated nitric acid and 70 ml of deionized water. Tin and nickel concentrations of the resulting solution was analyzed by the atomic absorption photometry.

TABLE 1

| | Example 1 | Comparative Experiment 1 |
|---|---|---|
| Tin (% by weight) | 68.5 | 70.7 |
| Nickel (% by weight) | 31.5 | 29.3 |
| Sulfur (%) | 32.4 | — |

Using the circuit substrates wherein the plating time was fixed at various values between 30 and 250 seconds, circuit boards were prepared in the following method. The circuit boards (which were produced so as to have the prescribed resistance value by the variation of the plating time) were tested for heat resistance and moisture resistance. The results were as shown in Table 2 below. The heat resistance was expressed in terms of rate of change in resistance value (%) after allowing to stand a speciman at 100° C. for 100 hours and the moisture resistance in terms of rate of change in resistance value (%) after allowing to stand a specimen under the conditions of 40° C. and 90% RH for 100 hours.

Figure 3:
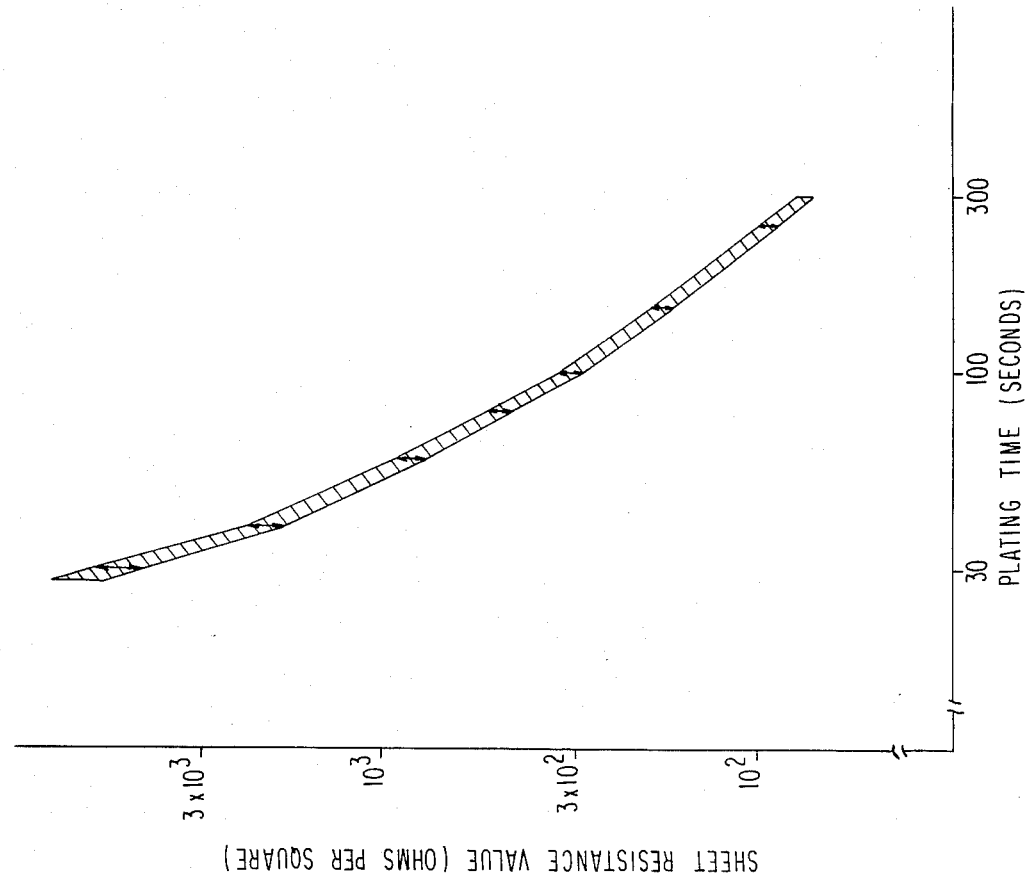
FIGS. 3, 5, 7, and 10 to 12 are graphs showing the properties of circuit boards with resistance elements of this invention.
Figure 2A:
FIGS. 2 (A) through (H) are explanatory diagrams showing a typical production step for the formation of a prescribed circuit board from the circuit substrate with a resistance layer of this invention.
Figure 2B:
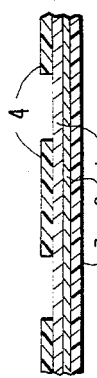
Figure 2C:
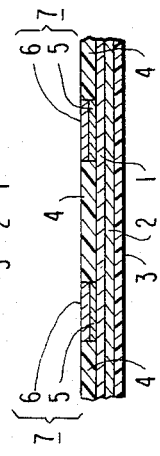
Figure 2D:
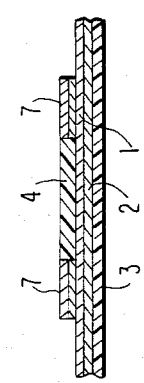
Figure 2E:
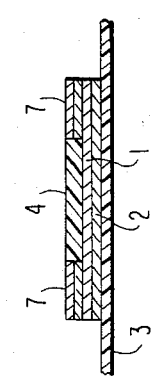
Figure 2F:
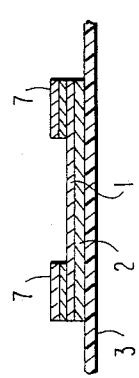
Figure 2G:
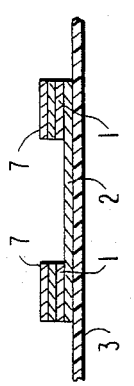
Figure 2H:
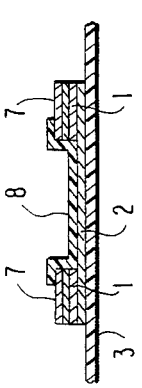

The circuit boards thus obtained were tested for average resistance value over the entire board surface and for resistance distribution to average resistance value of the same (range of scattering) to find the correlation between their values and the plating time. The results were as shown in FIG. 3.

Production of Circuit Board with a Resistance Element

The circuit substrate with a resistance layer was immersed in the above-described cleansing solution at room temperature for 3 minutes, washed with water, and dried. Subsequently, a film of photoresist, AZ-111 (positive-type photoresist made by Shiply Company Inc.), was formed on the surface of copper foil piece in the circuit substrate by dipping the circuit substrate in the bath of photoresist solution, lifting it at a rate of 5 to 10 cm/minute at room temperature from the bath, and drying it at 80° C. for 20 minutes.

The film of photoresist was irradiated with the light of a super-high voltage mercury-vapor lamp of 3 KW (HMW-N6-3 made by Oak Manufactory, irradiation distance 65 cm) for an accumulated dose of 450 mj/cm$^2$ to print a prescribed pattern for the purpose of applying nickel plating and gold plating to each electrode portion of the plurality of resistance elements. Thereafter, the film of photoresist thus treated was developed at room temperature for 3 minutes with AZ-303 (alkali developing solution made by Shiply Company Inc.) to remove the film of photoresist from the each electrode portion. After this development, the circuit substrate was washed with running water and then deionized water for 30 to 60 seconds. It was then treated with the above-described ammonium persulfate treating solution at room temperature for 30 seconds and washed with water. To the portions of surface exposed by the removal of the film of photoresist, nickel plating was applied under the conditions of 2 A/dm$^2$, 50° C., and 6 minutes and to the nickel plating thus formed, gold plating was applied under the conditions of 0.5 A/dm$^2$, 40° C., and 20 minutes. The circuit substrate was washed with water and dried to form a plurality of paired electrodes.

Then, the circuit substrate was exposed to the light using the above-described light source under the same conditions as described above through a photomask which allows the film of photoresist to remain on the resistance elements, and developed and washed with water under the same conditions to remove the film of photoresist from the portions other than those of the resistance elements. Thereafter, the electrolytic copper foil piece exposed through the removed portions of the film of photoresist was etched out with the above-described Neutra-Etch V-1. The resulting circuit substrate was washed with water and the unnecessary resistance layer exposed through the removed portions of the copper foil piece was etched out with an etching solution of 335 ml of concentrated sulfuric acid, 15 ml of concentrated nitric acid, 50 ml of concentrated hydrochloric acid, 10 ml of hydrogen peroxide solution, and 590 ml of deionized water.

Subsequently, the film of photoresist still remaining on the portions of the resistance elements was removed by immersion in acetone at room temperature for 10 to 20 seconds. The copper foil piece exposed through the removed portions of the film of photoresist was etched out with the same etching solution (Neutra-Etch V-1) as described above. The circuit board was thoroughly washed with deionized water and dried. Consequently, the layer of resistance elements connected to the paired electrodes was exposed. The exposed portions of resistance elements were used as so-called resistor. To these resistors and to the portion of the electrodes approximating to these resistors, solder-resist ink was applied by screen printing. By curing the applied ink with heat under prescribed conditions, the desired circuit board with a resistor was obtained.

TABLE 2

| Resistance value (ohms per square) | | Heat resistance (%) | Moisture resistance (%) |
| --- | --- | --- | --- |
| Example 1 | 180 | 0.5 | 0.3 |
| | 485 | 0.9 | 0.5 |
| | 1700 | 1.5 | 1.6 |
| Comparative | 50 | 0.4 | 0.1 |
| Experiment 1 | 165 | 0.6 | 0.2 |
| | 280 | 0.9 | 0.4 |

Comparative Experiment 1

Figure 4:
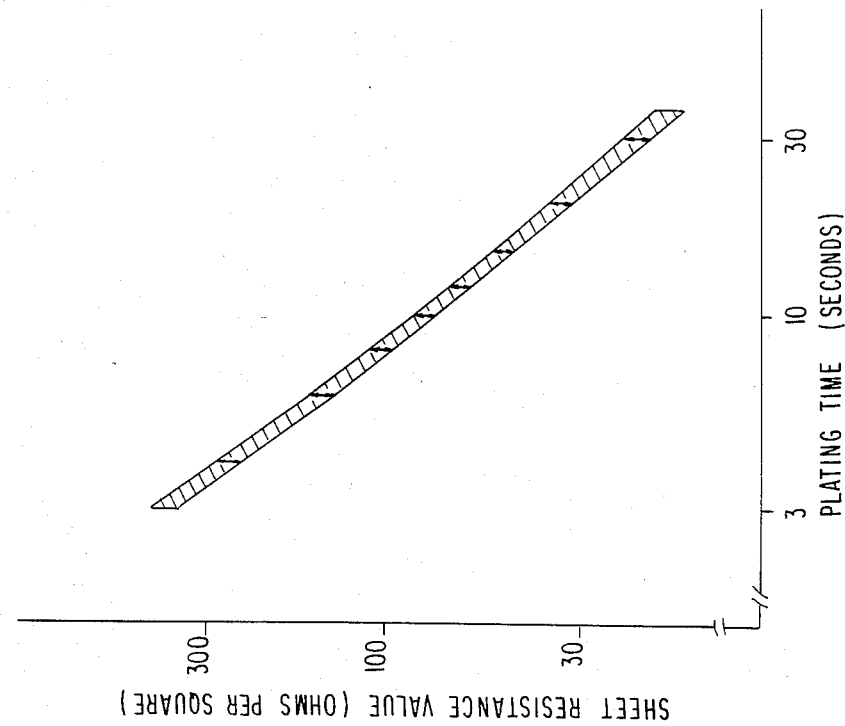
FIGS. 4, 6, and 8 are graphs showing the properties of circuit boards with resistance elements obtained in the comparative examples.

Circuit substrates with a resistance layer were obtained in the same manner as in Example 1 except that the addition of cysteine hydrochloride to the plating solution for plating resistance layer was omitted and the plating conditions were changed to 0.5 A/dm$^2$, 25° C., and 4 to 30 seconds. The alloy composition of the resistance layer in the circuit substrate (plating time 150 seconds) is also shown in Table 1 above. From the circuit substrates, circuit boards were obtained again in the same manner as in Example 1. These circuit boards were tested for to find the correlation between the resistance value and the plating time. The results were as shown in FIG. 4. It is apparent from the results that the resistance value offered by the circuit substrates were on the order of 300 ohms per square at most. The circuit boards were further tested for heat resistance and moisture resistance similarly to those of Example 1. The results are shown in Table 2 above.

EXAMPLE 2

Circuit substrates with a resistance layer were obtained in the same manner as in Example 1 except that the addition of glycine to the plating solution for plating resistance layer was omitted and the cysteine hydrochloride was substituted with 2.0 g/liter of cystine. The alloy composition of the resistance layer in the circuit substrate was analyzed in the same manner as in Example 1. It was found that the alloy contains 70.2% by weight of tin and 29.8% by weight of nickel. Through the ESCA measurement, the sulfur content of the alloy was found to be 19.2% of relative strength ratio to nickel contained.

Figure 5:
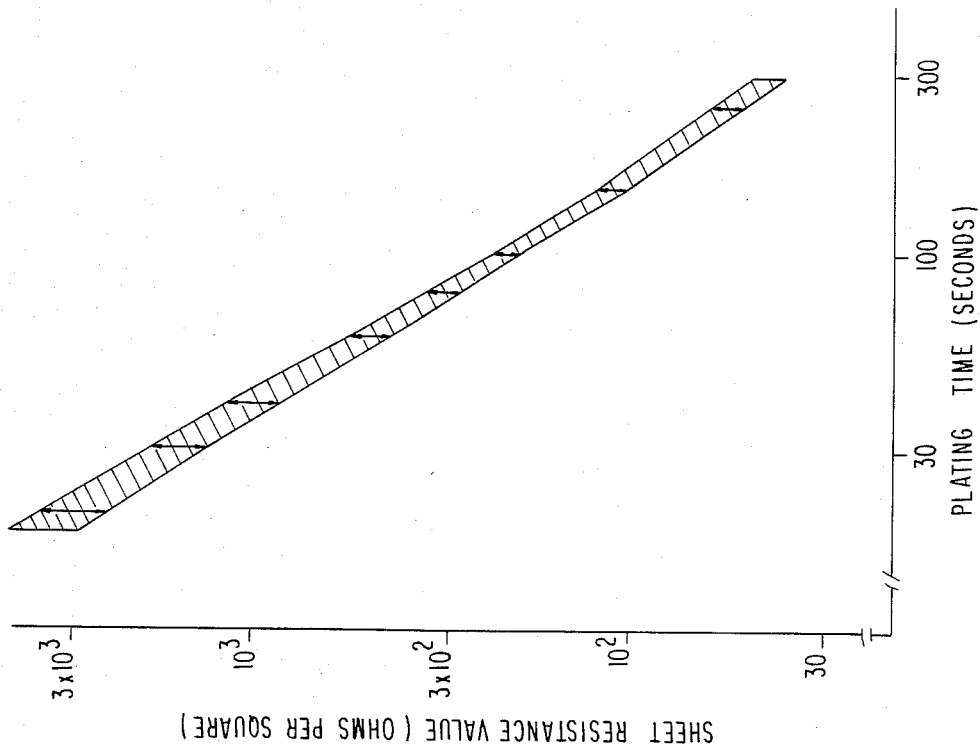

Then, using the above-described circuit substrates, circuit boards were produced in the same manner as in Example 1. The circuit boards were tested to find the correlation between the resistance value and the plating time. The results were as shown in FIG. 5. They were further tested for heat resistance and moisture resistance in the same manner as described above. The results were as shown in Table 3.

TABLE 3

| Resistance value (ohms per square) | Heat resistance (%) | Moisture resistance (%) |
| --- | --- | --- |
| 110 | 0.7 | 0.3 |
| 320 | 1.2 | 0.3 |
| 800 | 2.0 | 0.5 |

EXAMPLES 3–6

Circuit substrates with a resistance layer were obtained in the same manner as in Example 1 except that in the plating solution for formation of the alloy of resistance layer by plating, the stannous chloride content was changed to the range of 6 to 45 g/liter and the nickel chloride content in the range of 15 to 54 g/liter wherein the total of these two contents is 60 g/liter as shown in Table 4 and that 1.1 g/liter of homocystine was used in the place of cysteine hydrochloride. The alloy composition in these circuit substrates was analyzed. From these circuit substrates, circuit boards were produced similarly. Of these circuit boards, the circuit boards showing the resistance value of about 450 ohms per square were further tested for porperties. These results were as shown in Table 4.

TABLE 4

| | Example 3 | Example 4 | Example 5 | Example 6 | Comparative Experiment 2 | Comparative Experiment 3 |
| --- | --- | --- | --- | --- | --- | --- |
| $SnCl_2.2H_2O$ (g/liter) | 45 | 30 | 15 | 6 | 54 | — |
| $NiCl_2.6H_2O$ (g/liter) | 15 | 30 | 45 | 54 | 6 | 60 |
| $K_4P_2O_7$ (g/liter) | 200 | 200 | 200 | 200 | 200 | 200 |
| $NH_2CH_2COOH$ (g/liter) | 20 | 20 | 20 | 20 | 20 | 20 |
| Homocystine (g/liter) | 1.1 | 1.1 | 1.1 | 1.1 | 1.1 | 1.1 |
| Tin (% by weight) | 79.1 | 65.4 | 52.0 | 35.0 | 90.9 | — |
| Nickel (% by weight) | 20.9 | 34.6 | 48.0 | 65.0 | 9.1 | 100 |
| Sulfur (%) | 54.1 | 46.4 | 37.8 | 16.3 | 104.7 | 19.1 |
| Heat resistance (%) | 1.8 | 0.7 | −0.3 | 0.8 | 0.7 | — |
| Moisture resistance (%) | 0.3 | 0.3 | 0.2 | 0.4 | 0.1 | — |

Comparative Experiment 2

Figure 6:
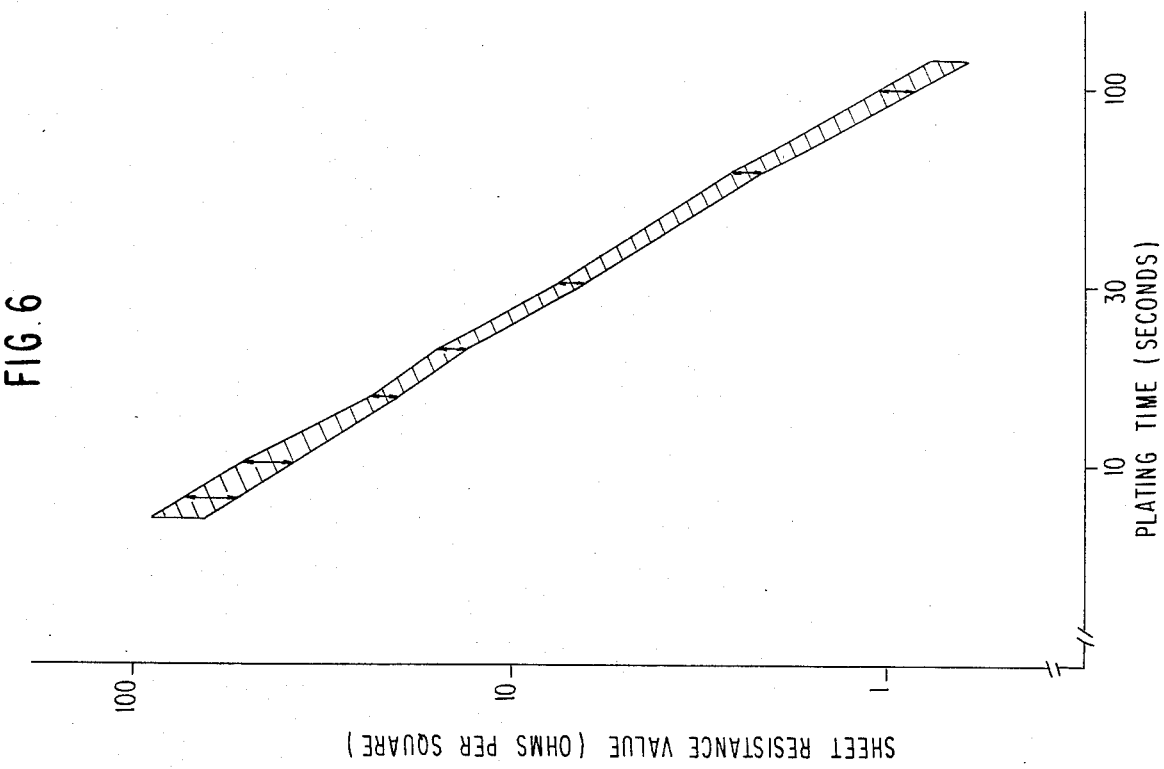

Circuit substrates with a resistance layer were obtained in the same manner as in Example 4 except that the plating solution for the formation of resistance layer by plating contained 6 g/liter of nickel chloride and 54 g/liter of stannous chloride. The composition of the alloy in this circuit substrate is also shown in Table 4 above. From these circuit substrates, circuit boards were similarly produced. The circuit boards were tested to find the correlation between the resistance value and the plating time (8 to 100 seconds). The results are shown in FIG. 6. They showed very low resistance values of 100 ohms per square or less. The circuit board having the resistance value of 60 ohms per square was tested for heat resistance and moisture resistance. The results are shown in Table 4.

Comparative Experiment 3

The procedure of Example 4 was followed to form a resistance layer by plating, except that the addition of stannous chloride was omitted and the amount of nickel chloride added was changed to 60 g/liter. At plating conditions that current density was 0.5 A/dm$^2$ and plating time was 5 minutes, the plated film of alloy did not produce a substantial resistance layer but gave a tarnished surface which was probably due to burn. For the sake of comparison, the resistance layer obtained after a plating treatment for a long period of time were tested for alloy composition. The results are shown in Table 4.

Examples 7-10

Circuit substrates with a resistance layer were obtained in the same manner as in Example 1 except that the plating solution used for the formation of the resistance layer was changed as indicated in Table 5 below. These circuit substrates were tested for alloy composition. Circuit boards were produced from the circuit substrates. Of these circuit boards, those having the resistance value of about 600 ohms per square were tested for properties. These results are shown in Table 5.

TABLE 5

|  | Example 7 | Example 8 | Example 9 | Example 10 |
|---|---|---|---|---|
| Stannous pyrophosphate (g/liter) | 50 | — | 50 | 25 |
| Stannuous chloride (g/liter) | — | 30 | — | 15 |
| Nickel sulfate (g/liter) | — | — | 17 | — |
| Nickel chloride (g/liter) | 30 | — | 15 | 30 |
| Nickel sulfamate (g/liter) | — | 40 | — | — |
| Potassium pyrophosphate (g/liter) | 150 | 250 | 200 | 200 |
| Glutamic acid (g/liter) | — | — | 5 | 5 |
| Glycine (g/liter) | 20 | 20 | 15 | 15 |
| Cystine (g/liter) | 2.0 | 2.0 | 2.0 | 2.0 |
| Tin (% by weight) | 67.0 | 67.0 | 69.5 | 68.3 |
| Nickel (% by weight) | 33.0 | 33.0 | 30.5 | 31.7 |
| Sulfur (%) | 57.5 | 31.5 | 23.6 | 51.6 |
| Heat resistance (%) | 1.8 | 0.9 | 1.6 | 1.1 |
| Moisture resistance (%) | 0.4 | 0.3 | 0.5 | 0.3 |

EXAMPLES 11-15

Figure 7:
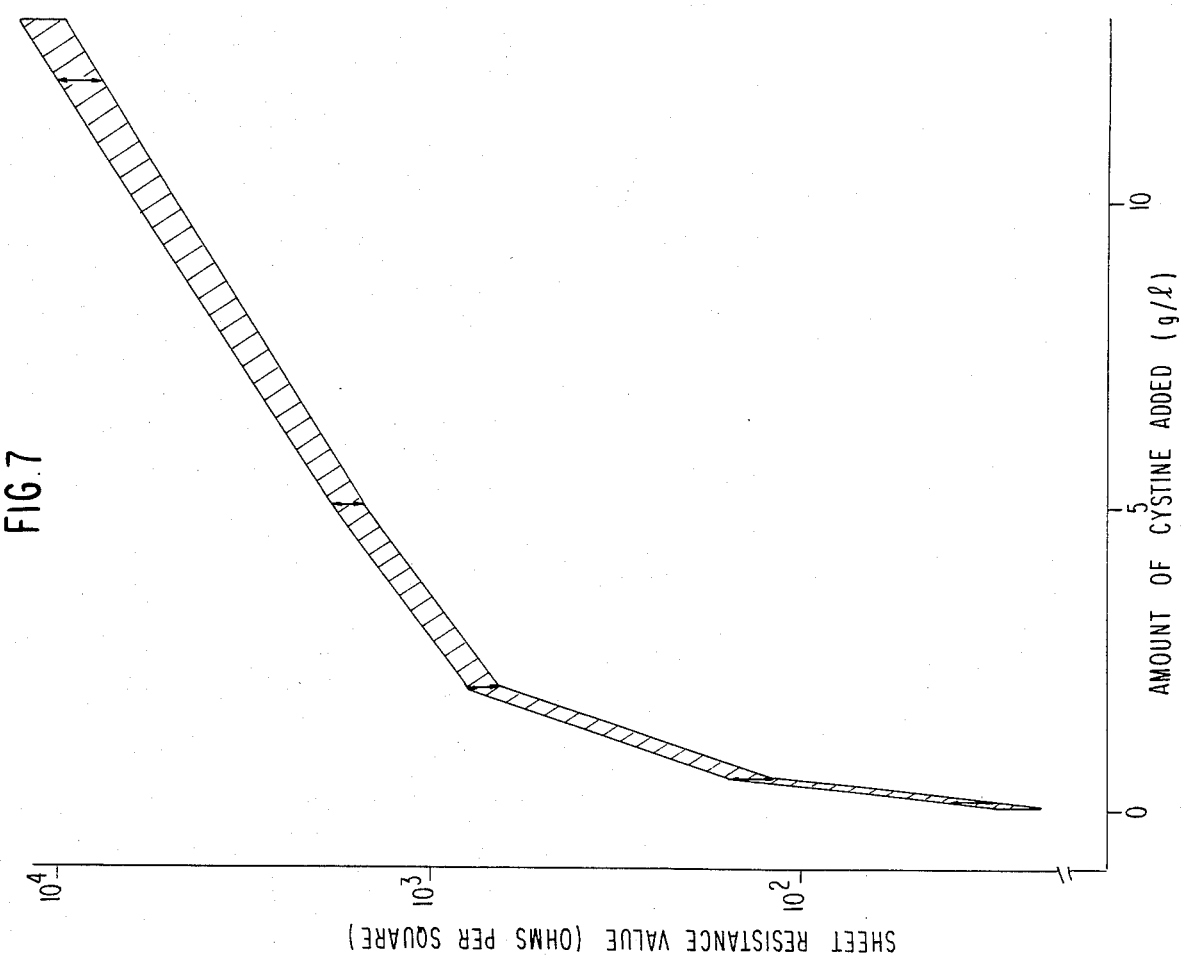

Circuit substrates with a resistance layer were obtained in the same manner as in Example 1 except that cystine was added in an amount of 0.1 to 12 g/liter in the place of cysteine hydrochloride in the preparation of the plating solution for the formation of the resistance layer and that the plating time was fixed at 100 seconds. These circuit substrates were tested for alloy composition. Circuit boards produced from these circuit substrates were tested for heat resistance and moisture resistance. These results are shown in Table 6 below. The correlation between the amount of cystine added as described above and the sheet resistance value is shown in FIG. 7.

TABLE 6

|  | Example 11 | Example 12 | Example 13 | Example 14 | Example 15 |
|---|---|---|---|---|---|
| Amount of cystine added (g/liter) | 0.1 | 0.5 | 2.0 | 5.0 | 12.0 |
| Tin (% by weight) | 70.9 | 70.8 | 67.0 | 66.7 | 63.8 |
| Nickel (% by weight) | 29.1 | 29.2 | 33.0 | 33.3 | 36.2 |
| Sulfur (%) | 25.3 | 38.5 | 39.0 | 40.0 | 46.2 |
| Resistance value (ohms per square) | 25 | 145 | 730 | 1600 | 8500 |
| Heat resistance (%) | 0.3 | 0.5 | 0.8 | 0.2 | ±0.1 |
| Moisture resistance (%) | 0.2 | 0.4 | 0.3 | 0.9 | 2.5 |

EXAMPLES 16-21

Circuit substrates with a resistance layer were obtained in the same manner as in Example 1 except that the plating solution used for the formation of the resistance layer was changed as shown in Table 7. The circuit substrates were tested for alloy composition. Circuit boards were produced from these circuit substrates. Of the circuit boards, those showing the resistance value of about 900 ohms per square were tested for properties. These results are shown in Table 7.

Comparative Experiment 4

Figure 8:
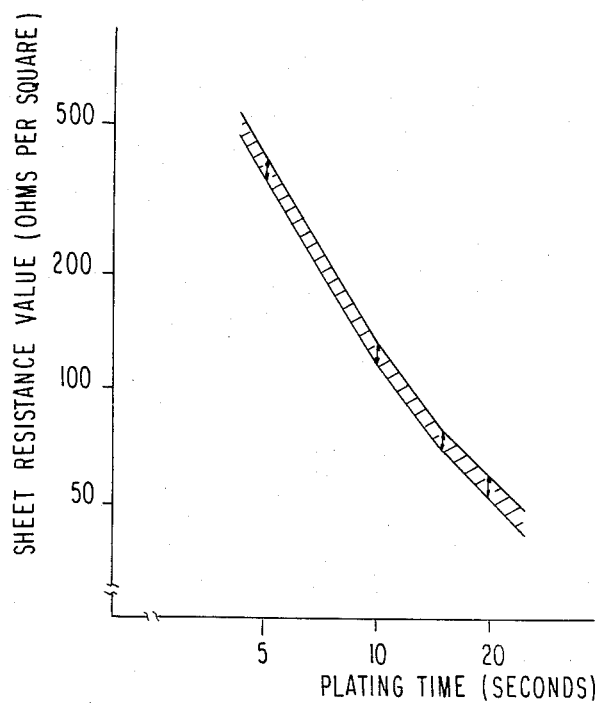

A circuit substrate with a resistance layer was obtained in the same manner as in Example 21 except that in the plating solution used for the formation of the resistance layer, the addition of dithiodiglycollic acid was omitted, the amount of stannous chloride (dihydrate) and that of nickel chloride (hexahydrate) were changed both to 20 g/liter, and the amount of sodium molybdate (dihydrate) was changed to 10 g/liter. The circuit substrate was tested for alloy composition of the resistance layer. The results are shown in Table 7. Using the circuit substrates, circuit boards were produced. The circuit boards were tested to find the correlation between the resistance value and the plating time (5 to 20 seconds). The results are shown in FIG. 8. The possible highest resistance value obtained in this circuit board was 400 ohms per square. The circuit board showing the resistance value of 125 ohms per square was tested for heat resistance and moisture resistance. The results are shown in Table 7.

TABLE 7

|  | Example 16 | Example 17 | Example 18 | Example 19 | Example 20 | Example 21 | Comparative Experiment 4 |
|---|---|---|---|---|---|---|---|
| $SnCl_2.2H_2O$ (g/liter) | 30 | 30 | 30 | 30 | 30 | 30 | 20 |
| $Ni_2P_2O_7.6H_2O$ (g/liter) | — | — | — | 40 | — | — | — |
| $NiCl_2.6H_2O$ (g/liter) | 30 | 30 | 30 | — | 30 | 30 | 20 |
| $Cu_2P_2O_7.3H_2O$ (g/liter) | — | — | — | 1.5 | — | — | — |
| $FeSO_4.7H_2O$ (g/liter) | — | — | — | — | 2.8 | — | — |
| $Na_2MoO_4.2H_2O$ (g/liter) | — | — | — | — | — | 7.3 | 10 |
| $K_4P_2O_7$ (g/liter) | 165 | 165 | 165 | 200 | 170 | 175 | 175 |
| Glycine (g/liter) | 25 | 25 | 20 | 20 | 25 | 25 | 25 |
| Thioglycollic acid (g/liter) | 5.5 | — | — | — | 5.5 | — | — |
| Thiomalic acid (g/liter) | — | — | 18 | — | — | — | — |
| Dithiodiglycollic acid (g/liter) | — | 5.5 | — | 5.0 | — | 5.5 | — |
| Homocystein-thiolactone hydrochloride (g/liter) | — | — | — | 0.5 | — | — | — |
| Tin (% by weight) | 67.3 | 68.4 | 68.2 | 71.8 | 65.6 | 68.3 | 70.2 |
| Nickel (% by weight) | 32.7 | 31.6 | 31.8 | 26.5 | 34.3 | 29.3 | 29.3 |
| Copper (% by weight) | — | — | — | 1.7 | — | — | — |

TABLE 7-continued

| | Example 16 | Example 17 | Example 18 | Example 19 | Example 20 | Example 21 | Comparative Experiment 4 |
|---|---|---|---|---|---|---|---|
| Iron (% by weight) | — | — | — | — | 0.1 | — | — |
| Molybdenum (% by weight) | — | — | — | — | — | 2.4 | 0.5 |
| Sulfur (%) | 20.7 | 32.5 | 22.8 | 16.8 | 39.2 | 71.2 | — |
| Heat resistance (%) | 0.7 | 0.6 | 1.0 | 0.7 | 0.7 | 1.0 | 0.7 |
| Moisture resistance (%) | 0.2 | 0.3 | 0.3 | 0.4 | 0.2 | 0.2 | 0.1 |

EXAMPLES 22-27

Circuit substrates with a resistance layer were obtained in the same manner as in Example 1 except that the plating solution used for the formation of the resistance layer had a composition as shown in Table 8. These circuit substrates were tested for alloy composition. Using these circuit substrates circuit boards were produced. Of these circuit boards, those showing resistance value of about 1200 ohms per square were tested for heat resistance and moisture resistance. These results are shown in Table 8.

REFERENCE EXAMPLE

Figure 9:
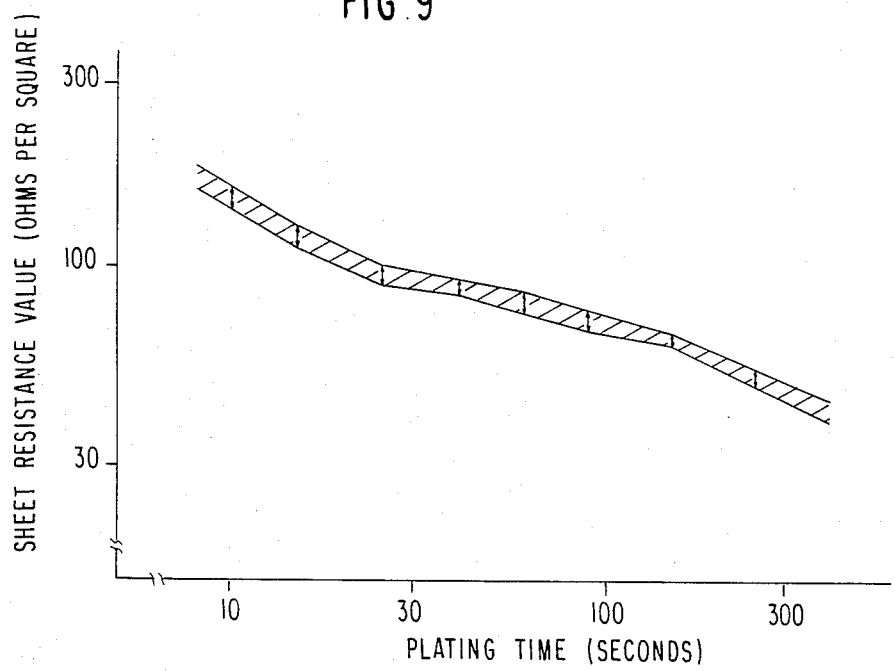
FIG. 9 is a graph showing the properties of a circuit board with resistance elements obtained in a reference example.

A circuit substrate with a resistance layer was obtained in the same manner as in Example 1 except that the plating solution composition of Example 23 further containing 3.5 g/liter of copper pyrophosphate was used as the plating solution for the formation of the resistance layer. The alloy composition in this circuit substrate is shown in Table 8. Using this circuit substrate, a circuit board was produced. The circuit board was tested to find the correlation between the resistance value and the plating time (10 to 250 seconds). The results are shown in FIG. 9. It is noted from the results that the highest resistance value was 150 ohms per square. The circuit board showing resistance value of about 100 ohms per square was tested for properties. The results are shown in Table 8.

produced. Of the circuit boards, those showing resistance value of about 800 ohms per square were tested for heat resistance and moisture resistance. These results are shown in Table 9.

TABLE 9

| | Example 28 | Example 29 | Example 30 | Example 31 | Example 32 |
|---|---|---|---|---|---|
| Plating bath temperature (°C.) | 30 | 30 | 30 | 45 | 60 |
| Plating current density (A/dm$^2$) | 0.1 | 0.5 | 2.5 | 2.5 | 2.5 |
| Tin (% by weight) | 72.8 | 68.3 | 57.9 | 59.8 | 69.2 |
| Nickel (% by weight) | 27.2 | 31.7 | 42.1 | 40.2 | 30.8 |
| Sulfur (%) | 39.4 | 37.8 | 38.6 | 35.4 | 40.3 |
| Heat resistance (%) | 1.4 | 1.1 | 0.8 | 1.2 | 1.3 |
| Moisture resistance (%) | 0.7 | 0.8 | 0.6 | 0.8 | 0.7 |

EXAMPLES 33-35

Circuit substrates with a resistance layer were obtained in the same manner as in Example 26 except that the amount of cystine incorporated in the plating solution for the formation of the resistance layer was invariably changed to 5.0 g/liter and the plating current density was changed to 0.5 A/dm$^2$ (Example 33), 1.0 A/dm$^2$ (Example 34), and 2.0 A/dm$^2$ (Example 35). These circuit substrates were tested for resistance alloy composition, with the total plating amount fixed at 75

TABLE 8

| | Example 22 | Example 23 | Example 24 | Example 25 | Example 26 | Example 27 | Reference Experiment |
|---|---|---|---|---|---|---|---|
| SnCl$_2$.2H$_2$O (g/liter) | 30 | 35 | 30 | — | 30 | 30 | 35 |
| Sn$_2$P$_2$O$_7$ (g/liter) | — | — | — | 50 | — | — | — |
| NiCl$_2$.6H$_2$O (g/liter) | 30 | 35 | 30 | 30 | 30 | 30 | 35 |
| Cu$_2$P$_2$O$_7$.3H$_2$O (g/liter) | 1.5 | 7.1 | 1.5 | 1.5 | — | — | 10.6 |
| CoCl$_2$.6H$_2$O (g/liter) | — | — | — | — | 2.4 | — | — |
| ZnSO$_4$.7H$_2$O (g/liter) | — | — | — | — | — | 11.5 | — |
| K$_4$P$_2$O$_7$ (g/liter) | 175 | 200 | 0 | 200 | 175 | 170 | 200 |
| K$_5$P$_3$O$_{10}$ (g/liter) | — | — | 200 | — | — | — | — |
| Glycine (g/liter) | 10 | 15 | 20 | 25 | 25 | 25 | 15 |
| Cystine (g/liter) | 10 | 1.5 | 5.0 | — | 2.0 | — | 1.5 |
| Cysteine hydrochloride (g/liter) | — | — | — | 1.5 | — | — | — |
| Homocystine (g/liter) | — | — | — | — | — | 1.4 | — |
| Tin (% by weight) | 60.1 | 50.5 | 71.3 | 68.0 | 68.1 | 73.6 | 39.5 |
| Nickel (% by weight) | 35.8 | 33.7 | 26.9 | 29.2 | 30.1 | 26.0 | 26.1 |
| Copper (% by weight) | 4.1 | 15.8 | 1.8 | 2.8 | — | — | 34.4 |
| Cobalt (% by weight) | — | — | — | — | 1.8 | — | — |
| Zinc (% by weight) | — | — | — | — | — | 0.4 | — |
| Sulfur (%) | 42.5 | 28.2 | 23.2 | 13.5 | 27.1 | 57.5 | 30.4 |
| Heat resistance (%) | 1.2 | 2.5 | 0.9 | 1.1 | 1.0 | 1.3 | 0.4 |
| Moisture resistance (%) | 0.5 | 0.9 | 0.3 | 0.5 | 0.4 | 1.2 | 0.2 |

EXAMPLES 28-32

Figure 12:
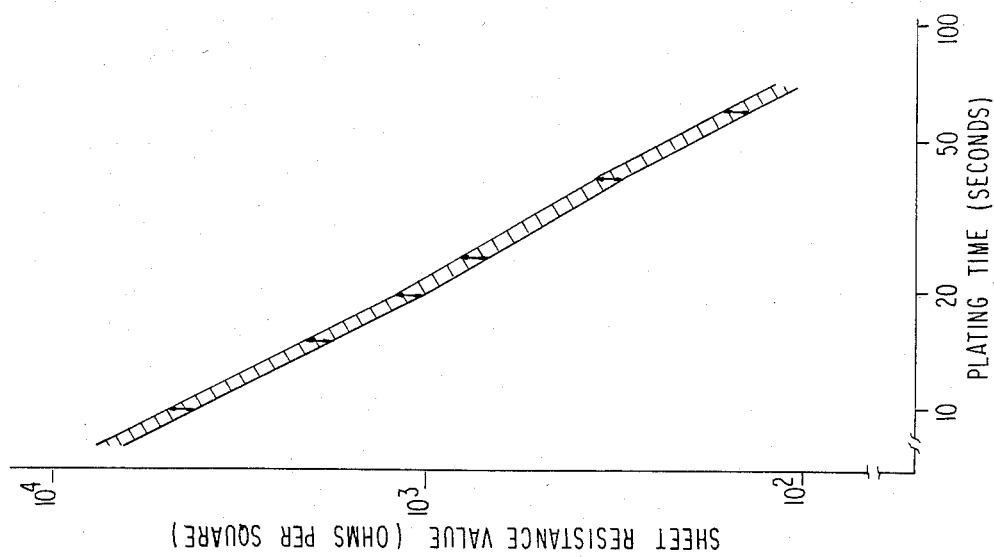
Figure 11:
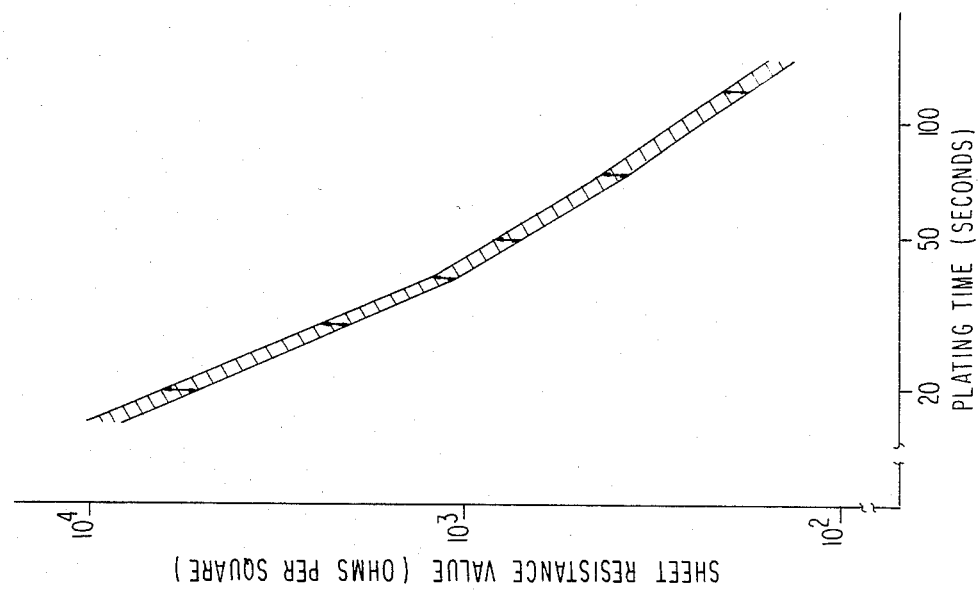
Figure 10:
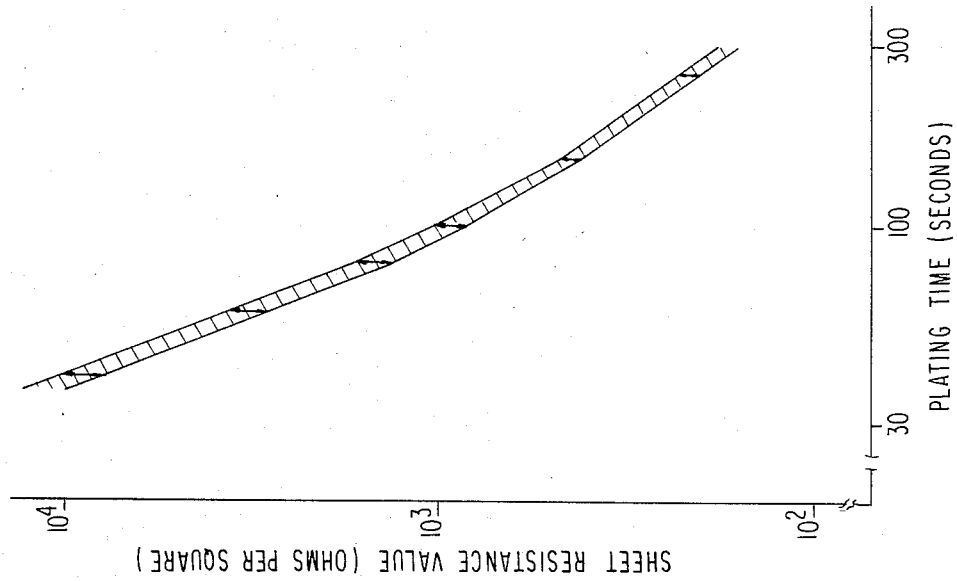

Circuit substrates with a resistance layer were obtained in the same manner as in Example 13 except that the plating conditions were varied in the ranges of 0.1 to 2.5 A/dm$^2$ and 30° to 60° C. as shown in Table 9 below. The circuit substrates were tested for alloy composition. Using these circuit substrates, circuit boards were produced. These circuit boards were tested to find the correlation between the resistance value and the plating time (10 to 250 seconds). The results are shown in FIGS. 10-12. Of the circuit boards, those showing the resistance values of about 450, 1200, and coulombs/dm$^2$ similarly to Example 1. The results are shown in Table 6. Using these circuit substrates, circuit boards were produced. These circuit boards were tested to find the correlation between the resistance value and the plating time (10 to 250 seconds). The results are shown in FIGS. 10-12. Of the circuit boards, those showing the resistance values of about 450, 1200, and 4000 ohms per square were tested for heat resistance and moisture resistance. The results are shown in Table 10.

TABLE 10

|  |  | Example 33 | Example 34 | Example 35 |
|---|---|---|---|---|
| Tin | (% by weight) | 66.2 | 68.5 | 68.6 |
| Nickel | (% by weight) | 31.5 | 28.8 | 28.4 |
| Cobalt | (% by weight) | 2.3 | 2.7 | 3.0 |
| Sulfur | (%) | 60.1 | 37.3 | 50.0 |
| Resistance value (ohms per square) |  |  |  |  |
| Heat resistance (%) | 450 | 0.8 | 1.1 | 0.9 |
|  | 1,200 | 0.7 | 0.7 | 1.0 |
|  | 4,000 | 0.7 | 1.2 | 1.2 |
| Moisture resistance (%) | 450 | 0.4 | 0.4 | 0.4 |
|  | 1,200 | 0.4 | 0.4 | 0.5 |
|  | 4,000 | 0.6 | 0.6 | 0.9 |

While the invention has been described in detail and with reference to specific embodiment thereof, it will be apparent to one skilled in the art that various changes and modifications can be made therein without departing from the spirit and scope thereof.

What is claimed is:

1. A circuit substrate with a resistance layer comprising an electrically insulating layer, a resistance layer bonded to at least one surface of the electrically insulating layer and a highly conductive material layer bonded to the resistance layer, wherein the resistance layer comprises an alloy containing 30 to 85% by weight of tin, and 70 to 15% by weight of nickel, each based on the total weight of tin and nickel, and sulfur in an amount corresponding to a relative strength ratio to nickel contained of 5 to 70% determined by the ESCA measurement.

2. The circuit substrate of claim 1, wherein the alloy further contains at least one element X selected from the group consisting of copper, silver, zinc, manganese, iron, cobalt, molybdenum, tungsten and palladium.

3. The circuit substrate of claim 2, the alloy contains 30 to 84.99% by weight of tin, 15 to 69.99% by weight of nickel and 0.01 to 30% by weight of the element X, each based on the total weight of tin, nickel and the element X.

4. The circuit substrate of claim 1, wherein a sheet resistance value of the resistance layer is from 400 ohms to about 10 kilo-ohms per square.

* * * * *